United States Patent [19]
Blomgren et al.

[11] Patent Number: 6,124,735
[45] Date of Patent: Sep. 26, 2000

[54] METHOD AND APPARATUS FOR A N-NARY LOGIC CIRCUIT USING CAPACITANCE ISOLATION

[75] Inventors: James S. Blomgren; Terence M. Potter; Stephen C. Horne; Michael R. Seningen; Anthony M. Petro, all of Austin, Tex.

[73] Assignee: Intrinsity, Inc., Austin, Tex.

[21] Appl. No.: 09/209,967

[22] Filed: Dec. 10, 1998

Related U.S. Application Data

[60] Provisional application No. 60/069,250, Dec. 11, 1997.

[51] Int. Cl.$^7$ .................... H03K 19/096; H03K 19/094
[52] U.S. Cl. ........................... 326/98; 326/98; 326/97; 326/93; 326/95; 326/112; 326/113; 326/119; 326/121; 326/15
[58] Field of Search ............................. 326/98, 97, 93, 326/95, 112, 119, 121, 131, 15

[56] References Cited

U.S. PATENT DOCUMENTS

| | | | |
|---|---|---|---|
| 5,661,675 | 8/1997 | Chin et al. | 364/768 |
| 5,886,541 | 3/1999 | Asato | 326/93 |
| 5,933,038 | 8/1999 | Klass | 327/208 |
| 5,959,465 | 9/1999 | Beat | 326/39 |
| 5,973,514 | 10/1999 | Kuo et al. | 328/98 |
| 6,011,410 | 1/2000 | Kim et al. | 326/96 |

*Primary Examiner*—Michael Tokar
*Assistant Examiner*—V. Tan
*Attorney, Agent, or Firm*—Booth & Wright, L.L.P.; Matthew J. Booth; Karen S. Wright

[57] ABSTRACT

The present invention comprises a logic device with improved capacitance isolation and a design methodology for reducing unwanted parasitic capacitance in logic circuits. The logic device further comprises an output signal having a first internal evaluate node and a second evaluate node. Additionally, the logic device comprises a first input signal that has a first input wire and a second input wire where the first input wire corresponds to a first possible value of the first input signal and the second input wire corresponds to a second possible value of the first input signal. The logic device further comprises a first plurality of intermediate nodes that includes a first intermediate node. Additionally, the logic device includes a first plurality of transistors that further includes a first transistor coupling the first internal evaluate node to the first intermediate node and being gated by the first wire of the first input signal. And finally, the logic device of the present invention includes a second transistor that couples the second internal evaluate node to the first intermediate node that is gated by the second wire of the first input signal. At most, one of the first internal evaluate node and the second internal evaluate node couples to the first intermediate node with the second transistor substantially preventing residual charge on the second internal evaluate node from being passed to the first intermediate node when the first input value corresponds to the first possible value.

23 Claims, 6 Drawing Sheets

METHOD AND APPARATUS FOR A N-NARY LOGIC CIRCUIT USING CAPACITANCE ISOLATION

This application claims the benefits of the earlier filed U.S. Provisional application Ser. No. 60/069,250, filed Dec.11, 1997, which is incorporated by reference for all purposes into this application.

BACKGROUND OF THE INVENTION

1. Field of the invention

The present invention relates to electronic devices, and more specifically to low-power, high-speed execution of algorithms in logic gates within electronic devices.

2. Description of Related Art

The majority of modern microprocessors are designed using a circuit family known as CMOS. In practice, CMOS circuits consume power only when switching states. CMOS consists of two kinds of transistors: P-channel and N-channel field effect transistors, or PFETs and NFETs, typically fabricated in roughly equal numbers on a common substrate. Static CMOS logic gates are constructed so that either the PFETs or the NFETs conduct, creating a path either to power or to ground, respectively. Except for the transient when the transistors are switching, PFETs and NFETs in a static CMOS circuit do not both conduct simultaneously. A CMOS logic gate consumes practically no DC power, and consumes AC power only when switching.

Since most chips initially constructed using this technology are slow by today's standards (one megahertz or less), most of the time signals were not switching, so the power consumed by a CMOS circuit was very low. Many portable devices were made possible by this technology. CMOS gained rapid favor for its ease of construction and simple design rules, as well as its tolerance for noise.

However, current applications of CMOS technology commonly run at very high clock rates of 200 megahertz or more. Ignoring technology differences, a circuit that used to burn so little power at 1 megahertz now burns 200 times that amount. Designing systems that incorporate processors and support logic that consume this much power is a problem both in getting the power in, and getting the resulting heat out.

One well-known CMOS design style with little DC power consumption is the non-inverting dynamic logic family. Non-inverting dynamic logic gates include an internal "evaluate" node that is precharged during one portion of a clock cycle, and then may (depending on input values) be discharged during a later portion of the clock cycle. The evaluate node then provides its voltage as an output from the logic gate. The power consumption of a dynamic CMOS circuit is equal to $fC_L(V_{DD}-V_{SS})^2$, where f is the frequency, $C_L$ is the switching capacitance, and $V_{DD}-V_{SS}$ defines the switching voltage range.

Another logic family with little DC power consumption is the new N-NARY logic family. N-NARY logic is more fully described in the co-pending application, U.S. Pat. app. Ser. No. 09/019,278, filed Feb. 5, 1998, pending, and entitled "Method and Apparatus for Reducing an Integrated Circuit's Power Consumption and Wire to Wire Capacitance Using 1 of N Signals" (hereinafter "N-NARY Patent"), which is incorporated by reference into this application. Due to the nature of the N-NARY style, various implementations for a given logic function exist, each of which differs in the structure of the N-tree. Different N-tree structures may have different amounts of parasitic capacitance, and thus different performance characteristics. It is the parasitic capacitance of the N-tree structure that slows down the evaluate transition of the logic gate.

The effect of parasitic or unwanted capacitance on gate speed is often difficult to quantify because there are actually two factors involved. The first (and more straightforward) factor is the amount of extra charge stored on the parasitic capacitance. The second factor (which is more difficult to quantify) is the additional amount of time it takes to conduct this additional charge to ground. This amount of time is related to the effective resistance of the path that is discharging the parasitic capacitance. The resistance is difficult to estimate because of the non-linear resistance of the transistors conducting the charge. The presence of extra charge in an N-tree causes higher voltages on the sources and drains of the transistors involved in conducting the charge to ground. Thus, the gate-source voltage of these transistors is reduced and their conductivity is degraded.

In general, it is most desirable to reduce parasitic capacitance that has a relatively long discharge path to ground. This is because the charge associated with this kind of capacitance will have the longest lasting effect on the conductivity of the transistors attempting to discharge the path. Of course, reducing any parasitic capacitance is beneficial, but sometimes a designer has to make a choice about which particular capacitance to reduce in a gate.

Another important effect of parasitic capacitance in CMOS logic gates and especially in dynamic logic gates is the unintended discharge of a node via charge sharing. In this case a certain node (such as the top of an N-tree stack) is intended to stay at a high voltage (i.e., not discharge). However, the node can be partially or largely discharged by having its charge drawn away by a parasitic capacitance with a lower voltage that is switched on to the node in question. The amount of voltage loss is related to the relative amounts of charge on the nodes involved in the transaction. Charge sharing is minimized by either ensuring the parasitic capacitance is at a benign voltage level or by minimizing the size of the parasitic capacitance.

Parasitic capacitance in CMOS gates comes from various sources. One source is the capacitance of the wires that connect together the various transistors in the gate. Another source is the transistor source/drain capacitance associated with each transistor. Source drain capacitance is present whether a gate is turned on or off. Another source is the channel capacitance of a transistor. This is the capacitance of the channel region of a transistor that is turned on or is in the conducting state. In addition to these static capacitance sources, the voltage waveforms on transistor gates can couple charge onto the source/drain nodes of transistors. Specifically, when a dynamic gate input rises, positive charge is transferred from the gate to this transistor's source and drain regions.

The parasitic capacitance presented by the drain of a transistor that is in the on state is large because it is comprised of that transistor's drain capacitance, its channel capacitance, the source capacitance (seen "through" the gate) and whatever other capacitance is attached to that transistor's source terminal. This is because the transistor drain and source terminals are connected by the resistance of the channel when the transistor is in the on state. Because of this, it is important to keep the parasitic transistors attached to an evaluate or discharge path that is turned off.

Capacitance isolation is the technique of improving gate delay and reducing charge sharing by the isolation of parasitic or unwanted capacitance from the part of the gate circuit actively involved in switching an output. This technique can be exploited to a great degree in the new N-NARY logic family to reduce gate size, improve gate speed, and reduce the severity of unwanted charge sharing. In particular, while not obvious, it is often possible to reduce unwanted parasitics in N-NARY gates by adding transistors in a judicious way, thereby increasing gate speed and/or overall gate area. The extent to which this design tradeoff may be made is unique to the N-NARY encoding of signals in this logic family.

The capacitance isolation technique discussed herein is not as applicable to traditional static CMOS logic because of the complimentary nature of the p- and n-transistor networks in a traditional CMOS gate. In the general case, the transistors that are the compliment of the active or conducting transistors have parasitic capacitance that is exposed to the output of the gate. PMOS transistors in particular have significant parasitic capacitance due to their larger size.

The technique is also applicable to traditional dual-rail dynamic logic, though the opportunities are not as great as in general N-NARY dynamic logic due to the larger fraction of turned-off transistors in general N-NARY logic.

SUMMARY

The present invention comprises a logic device with improved capacitance isolation. The logic device further comprises an output signal having a first internal evaluate node and a second internal evaluate node. Additionally, the logic device comprises a first input signal that has a first input wire and a second input wire where the first input wire corresponds to a first possible value of the first input signal and the second input wire corresponds to a second possible value of the first input signal. The logic device further comprises a first plurality of intermediate nodes that includes a first intermediate node. Additionally, the logic device includes a first plurality of transistors that further includes a first transistor coupling the first internal evaluate node to the first intermediate node and being gated by the first wire of the first input signal. And finally, the logic device of the present invention includes a second transistor that couples the second internal evaluate node to the first intermediate node that is gated by the second wire of the first input signal. At most, either the first internal evaluate node or the second internal evaluate node couples to the first intermediate node with the second transistor substantially preventing residual charge on the second internal evaluate node from being passed to the first intermediate node when the first input value corresponds to the first possible value.

BRIEF DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention comprises a digital circuit or logic family constructed in such a way that parasitic internal gate capacitance can be significantly reduced, allowing logic gates to perform their function faster, and allowing these logic functions to be built in less area than would otherwise be possible. In addition the present invention comprises design concepts and a design methodology that can be applied to all logic functions to decrease undesirable parasitic capacitance, thus potentially improving the performance of the logic gate. This disclosure describes numerous specific details that include specific structures, circuits, and logic functions in order to provide a thorough understanding of the present invention. One skilled in the art will appreciate that one may practice the present invention without these specific details.

Poor Capacitance Isolation: Structure of Intermediate nodes

Figure 1:
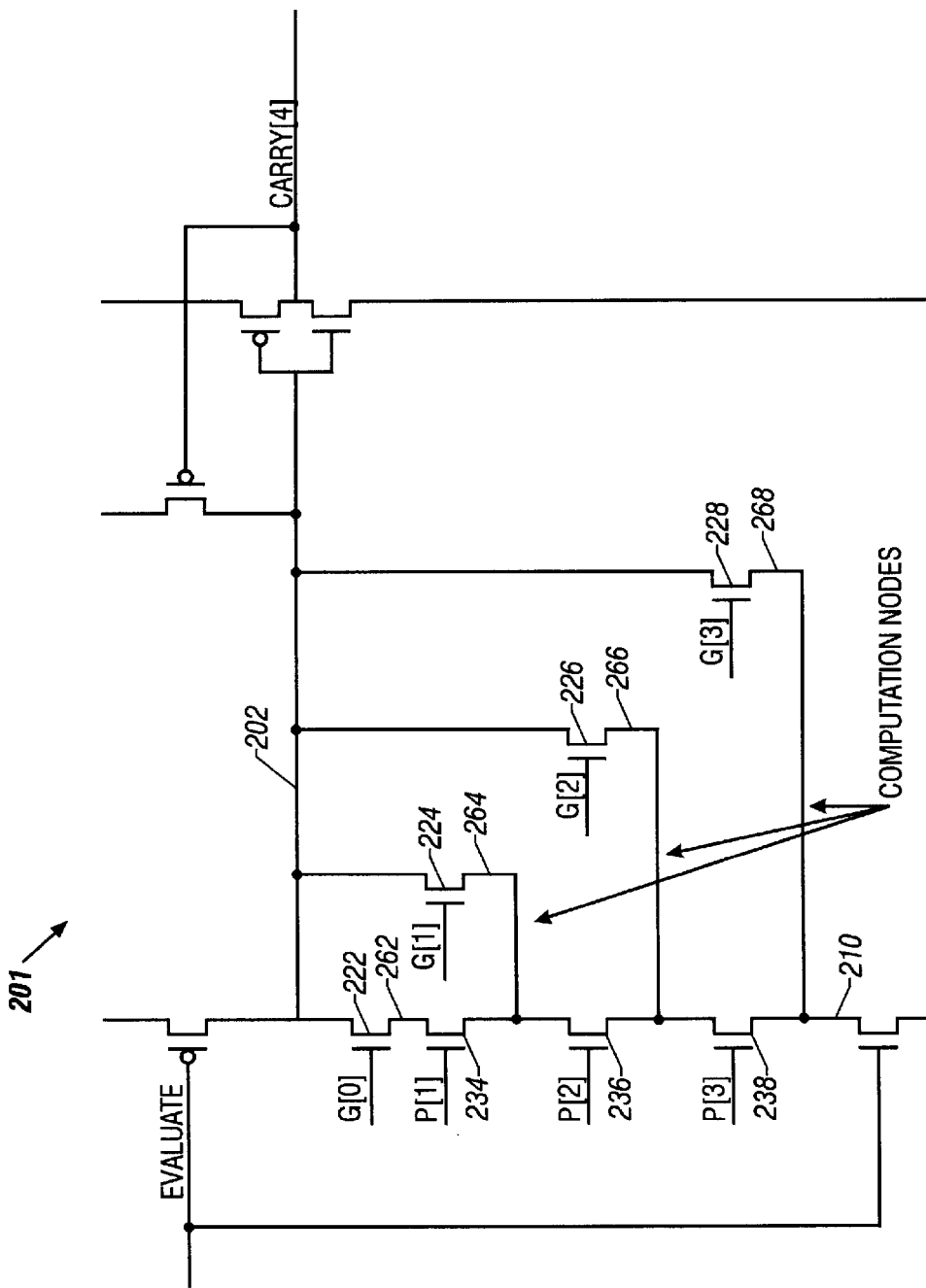
FIG. 1 is a N-NARY logic gate with poor capacitance isolation.

FIG. 1 shows an N-NARY logic gate 201 according to one embodiment of the present invention. As described in the N-NARY Patent, N-NARY logic gates are built around signals that have multiple (two or more) wires. The signal values are encoded so that at most one wire of the signal is active at a time. An N-NARY gate receives such N-NARY inputs and produces N-NARY outputs. Additionally, the intermediate (dynamic) nodes in the gate are also N-NARY in nature.

The N-NARY logic gate in FIG. 1 includes transistors 222, 224, 226, and 228. Transistors 222, 224, 226, and 228 are each gated by the "G" wire from a distinct input signal. For example, the "G" wires may indicate that a "generate" state is achieved at various cells in a multi-cell adder. G[0] may be a wire that has a high voltage when the least-significant (first) cell in an adder generates a carry; G[1] may be a wire that has a high voltage when a second cell in an adder generates a carry; G[2] may be a wire that has a high voltage when a third cell in an adder generates a carry; and G[3] may be a wire that has a high voltage when a fourth cell in an adder generates a carry. Similarly, the logic gate includes transistors 234, 236, and 238. Transistors 234, 236, and 238 are each gated by the "P" wire from a distinct input signal. For example, the "P" wires may indicate that a "propagate" state is achieved at various cells in a multi-cell adder. Without consideration of the first cell in an adder, P[1] may be a wire that has a high voltage when a second cell in an adder propagates a carry; P[2] may be a wire that has a high voltage when a third cell in an adder propagates a carry; and G[3] may be a wire that has a high voltage when a fourth cell in an adder propagates a carry.

The evaluate node 202 is coupled to a virtual ground node 210 via several paths. Each of the paths includes several transistors in a transistor "stack." For example, as shown in FIG. 1, one path includes transistors 222, 234, 236, and 238. A second path includes transistors 224, 236, and 238. A third path includes transistors 226 and 238. A fourth path includes transistor 228.

As shown in FIG. 1, the logic gate 201 also includes several intermediate nodes. For example, intermediate node 262 is coupled to evaluate node 202 via transistor 222 which is gated by wire G[0], and to intermediate node 264 via transistor 234 that is gated by wire P[1]. Intermediate node 264 is coupled to evaluate node 202 via transistor 224 which is gated by wire G[1], to intermediate node 262 via transistor 234 which is gated by wire P[1], and to intermediate node 266 via transistor 236 which is gated by wire P[2]. Intermediate node 266 is coupled to evaluate node 202 via transistor 226 which is gated by wire G[2], to intermediate node 264 via transistor 236 which is gated by wire P[2], and to intermediate node 268 via transistor 238 which is gated by wire P[3]. Intermediate node 268 is coupled to evaluate node 202 via transistor 228 which is gated by wire G[3], and to intermediate node 266 via transistor 238 which is gated by wire P[3].

Poor Capacitance Isolation: Non-evaluation paths

From a design perspective, the N-NARY logic gate of FIG. 1 has poor capacitance isolation. The various inputs select a path, which includes a stack of transistors, and a set of nodes intervening between adjacent transistors in the stack. Within a selected path, the intervening nodes between adjacent transistors in the stack are referred to as "computation nodes." Regardless of which path is selected, however, other intermediate nodes may be coupled to the computation nodes by other input signals. As shown in FIG. 1, for example, a first path includes transistors 222, 234, 236, and 238. When the first path is selected, the voltage on wires G[1], G[2], and G[3] is not known. If any of these three wires has a high voltage while the first path is selected, then multiple paths are selected simultaneously. Selecting multiple paths simultaneously may provide the correct result, in effect "ORing" the various paths, but comes at a cost.

One cost is the additional latency of such gates, arising from additional capacitance. There are many points within the evaluation stack of a traditional dynamic gate where multiple transistors connect to a single wire. Where this occurs, it is possible to encounter higher levels of capacitance than ordinarily expected.

Good Capacitance Isolation: Structure of Intermediate Nodes

Figure 2:
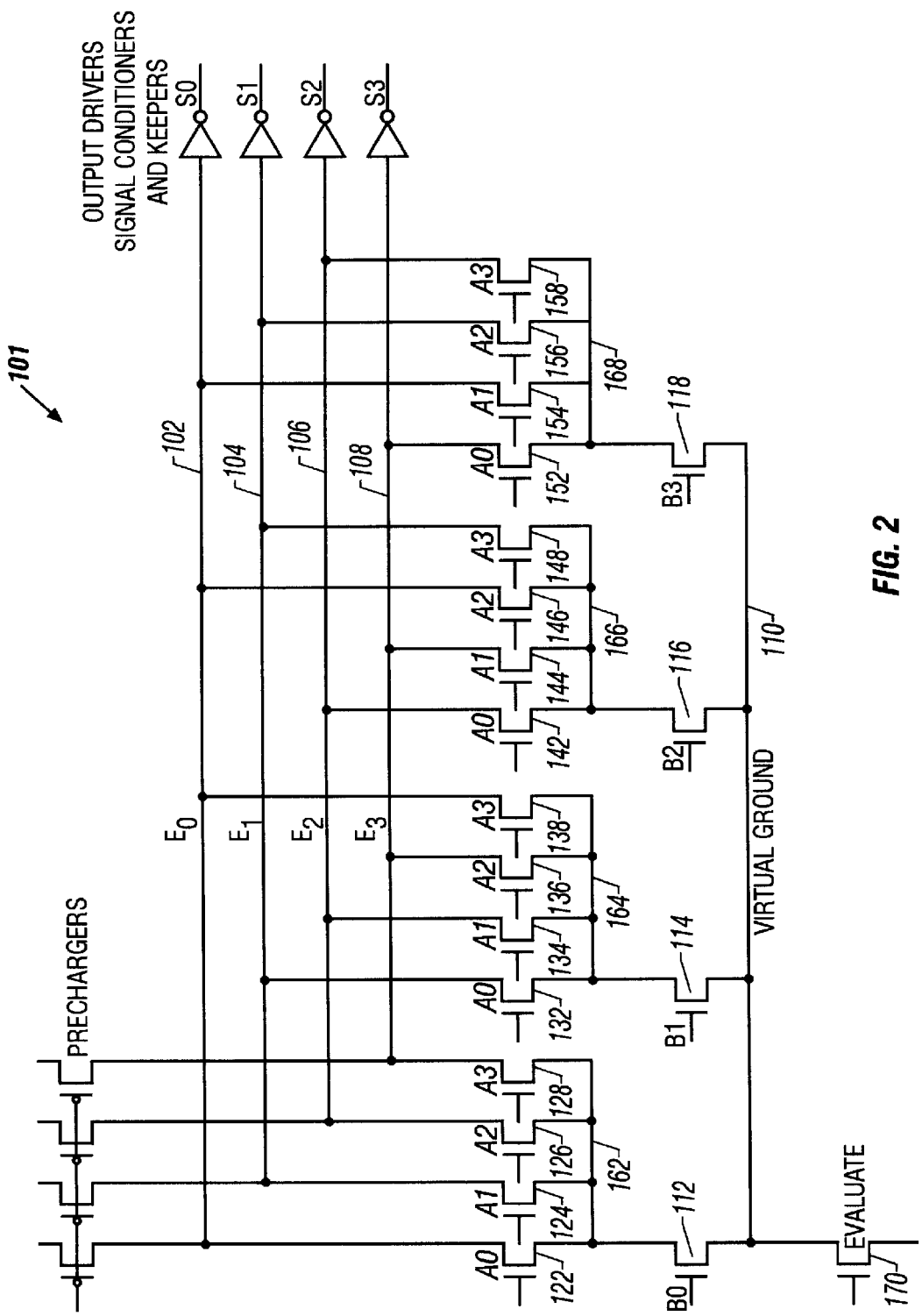
FIG. 2 is a N-NARY 1 of 4 adder gate with perfect capacitance isolation.

Referring now to FIG. 2, an N-NARY logic device according to one embodiment of the present invention is shown. The logic gate 101 shown in FIG. 2 has perfect capacitance isolation. Capacitance isolation refers to the ability of a gate to isolate parasitic capacitance from the path upon which the evaluate node is discharged. A gate that has perfect capacitance isolation has a path from the evaluate node to the virtual ground node with no node gated onto this path that is not part of the path through which the evaluate node is discharged.

As shown in FIG. 2, four internal evaluate nodes 102–108 are each coupled to a virtual ground node 110 via several parallel paths. Each of the parallel paths includes several transistors in a transistor stack. As shown in FIG. 2, the logic gate also includes several intermediate nodes. For example, intermediate node 162 is coupled to internal evaluate node 102 via transistor 122, to internal evaluate node 104 via transistor 124, to internal evaluate node 106 via transistor 126, and to internal evaluate node 108 via transistor 128.

Transistors 122, 124, 126, and 128 are collectively referred to as an N-NARY group of transistors. The transistors of an N-NARY group have a common conductivity type—all are n-channel, or all are p-channel. For various reasons explained in the N-NARY Patent, n-channel devices are preferred in the evaluate paths. Each transistor in an N-NARY group is gated by a distinct wire of an N-NARY signal. For example, transistors 122, 124, 126, and 128 are collectively gated by an N-NARY signal referred to as an "A" input signal. Also, each transistor in an N-NARY group shares one node connected to one of the non-gating terminals (i.e., either the source or drain) of the transistors in the N-NARY group. For example, the source terminals of transistors 122, 124, 126, and 128 are all coupled to the intermediate node 162.

Intermediate node 164 is coupled to internal evaluate node 102 via transistor 138, to internal evaluate node 104 via transistor 132, to internal evaluate node 106 via transistor 134, and to internal evaluate node 108 via transistor 136. Transistors 132,.134, 136, and 138 are collectively referred to as an N-NARY group of transistors. Transistors 132, 134, 136, and 138 are n-channel, and each is gated by a distinct wire of the "A" input signal. The source terminals of transistors 132, 134, 136, and 138 are all coupled to the intermediate node 164.

Intermediate node 166 is coupled to internal evaluate node 102 via transistor 146, to internal evaluate node 104 via transistor 148, to internal evaluate node 106 via transistor 142, and to internal evaluate node 108 via transistor 148. Transistors 142, 144, 146, and 148 are collectively referred to as an N-NARY group of transistors. Transistors 142, 144, 146, and 148 are n-channel, and each is gated by a distinct wire of the "A" input signal. The source terminals of transistors 142, 144, 146, and 148 are all coupled to the intermediate node 166.

Intermediate node 168 is coupled to internal evaluate node 102 via transistor 154, to internal evaluate node 104 via transistor 156, to internal evaluate node 106 via transistor 158, and to internal evaluate node 108 via transistor 152. Transistors 152, 154, 156, and 158 are collectively referred to as an N-NARY group of transistors. Transistors 152, 154, 156, and 158 are n-channel, and each is gated by a distinct wire of the "A" input signal. The source terminals of transistors 152, 154, 156, and 158 are all coupled to the intermediate node 168.

The N-NARY logic gate of FIG. 2 is designed so that when the input signal A has a value of 0, certain connections are made and other connections are excluded. In particular, when the input signal A has a value of 0, node 162 is connected to internal evaluate node 102 via transistor 122, and to no other internal evaluate node; node 164 is connected to internal evaluate node 104 via transistor 132, and to no other internal evaluate node; node 166 is connected to internal evaluate node 106 via transistor 142, and to no other internal evaluate node; and node 168 is connected to internal evaluate node 108 via transistor 152, and to no other internal evaluate node. The connections that are desired belong to the "evaluation path," while the connections that are not desired belong to "non-evaluation paths."

Similarly, when the input signal A has a value of 1, node 162 is connected to internal evaluate node 104 via transistor 124, and to no other internal evaluate node; node 164 is connected to internal evaluate node 106 via transistor 134, and to no other internal evaluate node; node 166 is connected to internal evaluate node 108 via transistor 144, and to no other internal evaluate node; and node 168 is connected to internal evaluate node 102 via transistor 154, and to no other internal evaluate node.

Similarly, when the input signal A has a value of 2, node 162 is connected to internal evaluate node 106 via transistor 126, and to no other internal evaluate node; node 164 is connected to internal evaluate node 108 via transistor 136, and to no other internal evaluate node; node 166 is connected to internal evaluate node 102 via transistor 146, and to no other internal evaluate node; and node 168 is connected to internal evaluate node 104 via transistor 156, and to no other internal evaluate node.

Finally, when the input signal A has a value of 3, node 162 is connected to internal evaluate node 108 via transistor 128, and to no other internal evaluate node; node 164 is connected to internal evaluate node 102 via transistor 138, and to no other internal evaluate node; node 166 is connected to internal evaluate node 104 via transistor 148, and to no other internal evaluate node; and node 168 is connected to internal evaluate node 106 via transistor 158, and to no other internal evaluate node.

Once a discharge path is selected by a combination of N-NARY signal inputs, only those transistors on the discharge path are able to discharge. In other words, there is no combination of inputs that couples any node onto the discharge path that is not intended to be part of the discharge path. This is an important concept. Consider the input combination that turns both transistors 122 and 112 on. In this case, the charge flows from the internal evaluate node 102 through transistors 122 and 112 to virtual ground 110. The internal evaluate node 102 also connects to transistors 138, 146, and 154, but because these transistors are off when transistor 122 is on, the nodes 164–168 below them are not connected to internal evaluate node 102. The N-NARY gate design in FIG. 2 performs the addition function with excellent capacitance isolation within the evaluate stack as well as at the top of the stack, which increases the speed of the gate. Note that when the gate terminal of transistor 122 is asserted, the outputs S1, S2 and S3 (internal evaluate nodes 104–108) are each connected to one of the internal nodes, but because these outputs (internal evaluate nodes 104–108) are not asserted, charge need not be moved from their output nodes. In other words, where MOS transistors do not switch, there is no need to increase speed. This is another critical consideration because it is not necessary to isolate capacitance from any output node which is not asserted.

Good Capacitance Isolation: Structure of Input Signals

N-NARY logic has an inherent advantage over traditional logic when it comes to minimizing parasitic capacitance, due to the structure of the N-NARY 1-of-N signal. As shown in FIG. 2, transistors 122, 132, 142, and 152 are all gated by the same wire of the input signal A and in particular by wire A0. Consequently, when the input signal A has a value of 0, transistors 122, 132, 142, and 152 conduct. The input signal A is N-NARY; therefore, when one wire of input signal A has a high voltage, all remaining wires belonging to the input signal A have a low voltage. The low voltage on the remaining wires belonging to the input signal A cause transistors gated by wires A1–A3 to be off. As a result, transistors 124, 126, and 128 do not conduct; transistors 134, 136, and 138 do not conduct; transistors 144, 146, and 148 do not conduct; and transistors 154, 156, and 158 do not conduct.

Like the transistors gated by wire A0, the transistors 124, 134, 144, and 154 are all gated by wire A1 of the input signal A. Consequently, when the input signal A has a value of 1, transistors 124, 134, 144, and 154 conduct. The low voltage on the remaining wires belonging to the input signal A cause transistors gated by wires A0, A2, and A3 to be off. As a result, transistors 122, 126, 128, 132, 136, 138, 142, 146, 148, 152, 156, and 158 do not conduct.

Similarly, transistors 126, 136, 146, and 156 are all gated by wire A2 of the input signal A. Consequently, when the input signal A has a value of 2, transistors 126, 136, 146, and 156 conduct. The low voltage on the remaining wires belonging to the input signal A cause transistors gated by wires A0, A1, and A3 to be off. As a result, transistors 122, 124, 128, 132, 134, 138, 142, 144, 152, 154, and 158 do not conduct.

Finally, transistors 128, 138, 148, and 158 are all gated by wire A3 of the input signal A. Consequently, when the input signal A has a value of 3, transistors 128, 138, 148, and 158 conduct. The low voltage on the remaining wires belonging to the input signal A cause transistors gated by wires A0, A1, and A2 to be off. As a result, transistors 122, 124, 126, 132, 134, 136, 142, 144, 146, 152, 154, and 156 do not conduct. The very nature of N-NARY signals provides excellent opportunity to incorporate the capacitance isolation techniques disclosed herein, because at any point in time in an N-NARY gate, each N-NARY signal will have only one of N wires asserted, and there will be a relatively high concentration of "off" transistors, as compared to traditional logic designs. This high concentration of "off" transistors make it much more likely that undesirable internal nodes will not be coupled to the evaluation path anyway.

Good Capacitance Isolation: Structure of Internal Evaluate Nodes

As discussed previously in FIG. 2, internal evaluate nodes 102, 104, 106 and 108 are each coupled to intermediate nodes 162, 164, 166 and 168 such that no internal evaluate node is ever directly or indirectly electrically connected to more than one intermediate node (and thus to virtual ground 110) at any given time. Therefore, the capacitance at the selected internal evaluate node during the evaluate mode of the gate is minimized.

Other Capacitance Reduction Techniques: Reducing Output Wires, Reducing Number of Transistors, and Sharing Computation Nodes Among Outputs The gate 101 as illustrated in FIG. 2 is implemented using a single evaluate transistor 170 and a single evaluate stack (i.e., the selected path), but multiple outputs are constructed. It may at first appear that the additional interconnect wires associated with the use of 1-of-N signals may increase overall capacitance. In fact, however, the use of 1-of-N signals allows several advantages over other logic families in capacitance reduction. The exemplary embodiment of the present invention greatly reduces the number of p-channel devices vis-a-vis traditional CMOS circuits. At similar drive strengths, p-channel devices have far more internal capacitance than n-channel devices, and the elimination of nodes required for complimentary PMOS functions provides a drastic reduction in capacitance. The exemplary embodiment of the present invention also reduces the number of n-channel devices coupled to each internal node of each logic circuit. In tandem with the elimination of p-channel devices, this provides a much simpler, faster circuit. Moreover, the exemplary embodiment of the present invention virtually eliminates parallel switching paths by configuring transistors in parallel paths such that only one path can conduct at any time.

As shown in FIG. 2, the adder gate 101 design includes very few p-channel field effect transistors. Not all functions have the capacitance isolation quality of add, but the same design concepts used in the adder can be applied to a greater or lesser extent to all N-NARY logic functions.

For example, FIGS. 3–6 are four logically identical designs of an AND gate in the N-NARY logic family, but each has a different N-tree structure and each has a different degree of parasitic capacitance. The logic function implemented in the gates of FIGS. 3–6 is a 2-bit boolean AND function. The circuit is difficult to understand upon first inspection because the 2-bit boolean operands and the 2-bit boolean result are encoded as N-NARY 1-of-4 values. The following table shows the both the N-nary encoded and the 2-bit boolean truth table that the AND gates in FIGS. 3–6 implement.

TABLE 1

| A (1-of-4) | A (2-bit boolean) | B (1-of-4) | B (2-bit boolean) | A&B (1-of-4) | A&B (2-bit boolean) |
|---|---|---|---|---|---|
| 0 | 00 | 0 | 00 | 0 | 00 |
| 0 | 00 | 1 | 01 | 0 | 00 |
| 0 | 00 | 2 | 10 | 0 | 00 |
| 0 | 00 | 3 | 11 | 0 | 00 |
| 1 | 01 | 0 | 00 | 0 | 00 |
| 1 | 01 | 1 | 01 | 1 | 01 |
| 1 | 01 | 2 | 10 | 0 | 00 |
| 1 | 01 | 3 | 11 | 1 | 01 |
| 2 | 10 | 0 | 00 | 0 | 00 |
| 2 | 10 | 1 | 01 | 0 | 00 |
| 2 | 10 | 2 | 10 | 2 | 10 |
| 2 | 10 | 3 | 11 | 2 | 10 |
| 3 | 11 | 0 | 00 | 0 | 00 |
| 3 | 11 | 1 | 01 | 1 | 01 |
| 3 | 11 | 2 | 10 | 2 | 10 |
| 3 | 11 | 3 | 11 | 3 | 11 |

Each of the signals A and B are encoded in a 1-of-4 fashion; when A and B are valid they each have exactly one wire at a high voltage and three wires at a low voltage. Table 2 illustrates this encoding.

TABLE 2

| Value of A | A[3] | A[2] | A[1] | A[0] |
|---|---|---|---|---|
| 0 | 0 | 0 | 0 | 1 |
| 1 | 0 | 0 | 1 | 0 |
| 2 | 0 | 1 | 0 | 0 |
| 3 | 1 | 0 | 0 | 0 |

Each version of the AND gate shown in FIGS. 3–6 implements the same logical function. However, the speed and/or area of the four different AND gates differs due to varying degrees of capacitance isolation.

Figure 3:
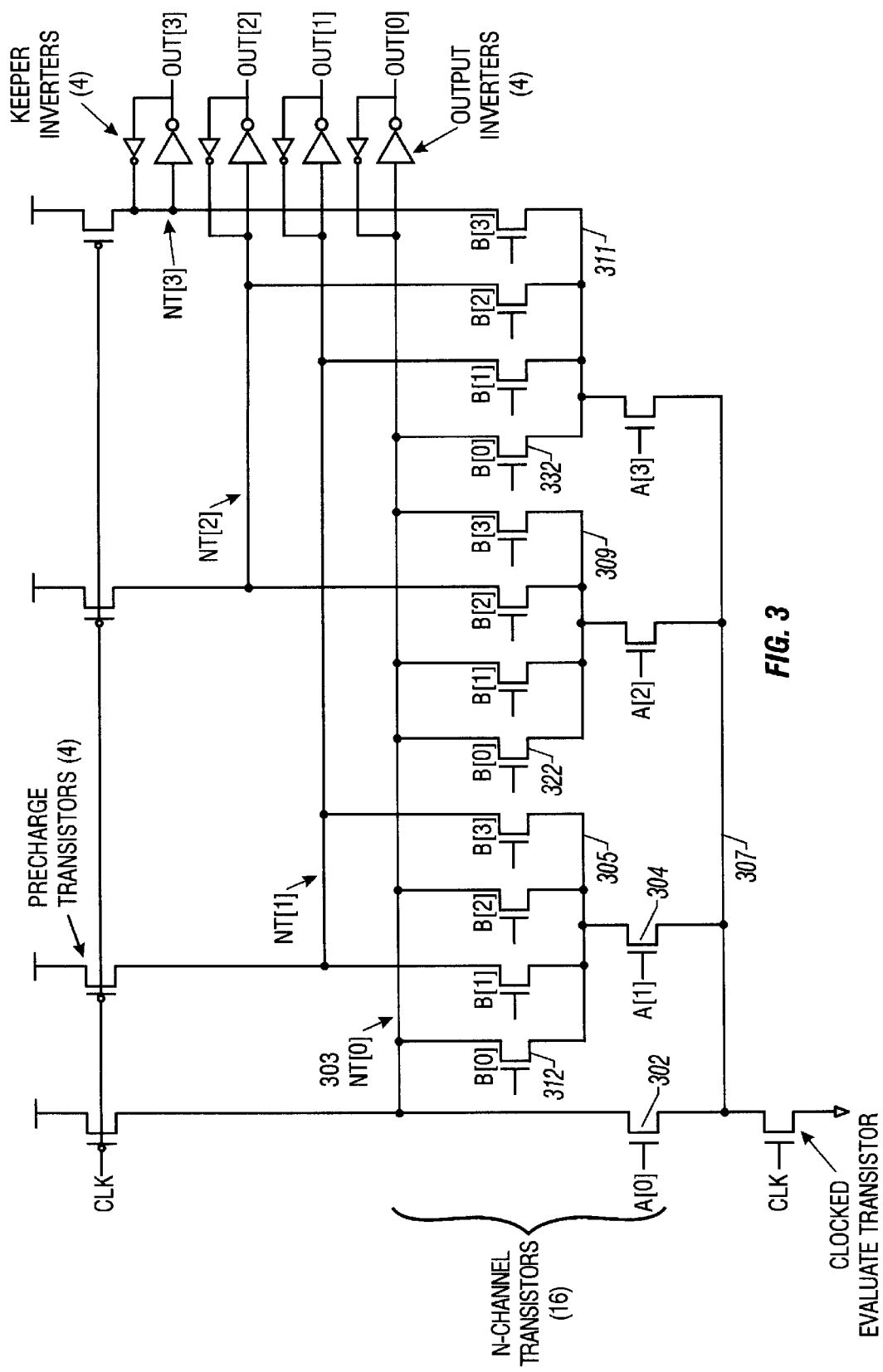
FIG. 3 is a N-NARY 1-of-4 AND gate with poor capacitance isolation.

FIG. 3 is the most straightforward implementation of the 2-bit boolean AND logic function in the N-NARY logic style. However, this implementation suffers from a parasitic capacitance problem for certain input combinations. For example, when A=1 and B=0, wires A1 and B0 are asserted, turning on transistors 304, 312, 322, and 332. The top-of-stack internal evaluate node NT[0] 303 is discharged through transistors 312 and 304 via intermediate computation nodes 305 and 307. However, because B=0 also turns on transistors 322 and 332, the charge on intermediate nodes 309 and 311 is exposed to the discharge path and must be conducted to ground in order for the internal evaluate node NT[0] 303 to evaluate low. Note that this gate has 16 N-channel transistors, not including the clocked evaluate transistor. There are 8 output gate transistors and 4 precharge transistors for a total of 28 transistors (not including the weak keepers on the output signals).

Figure 4:
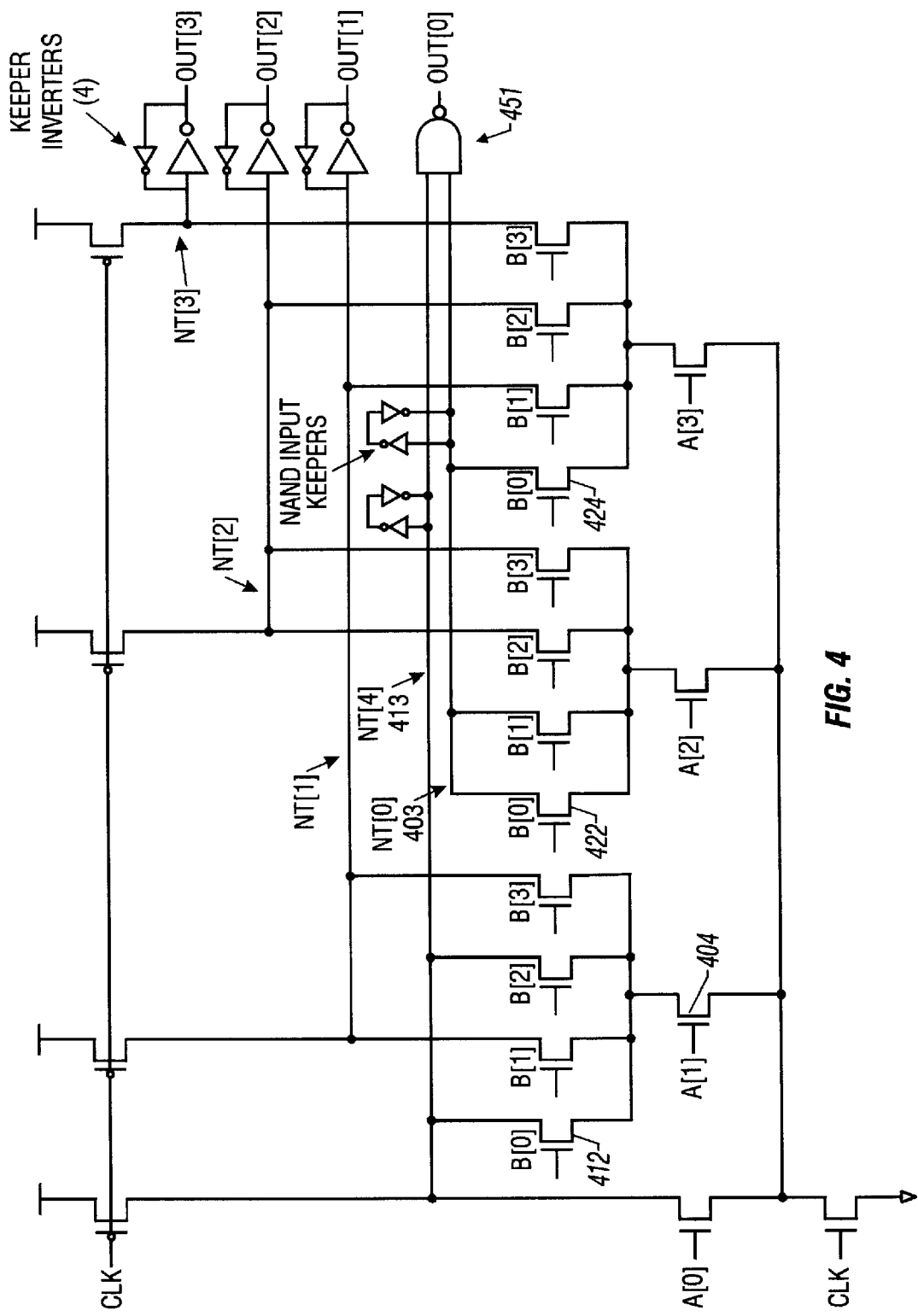
FIG. 4 is the N-NARY 1-of-4 AND gate of FIG. 3, with an internal evaluate node added in an attempt to decrease the parasitic capacitance and improve the performance of the gate.

FIG. 4 is an AND gate similar to that shown in FIG. 3, except that the parasitic capacitance on internal evaluate node NT[0] (303 in FIG. 3) has been reduced by adding another N-channel top-of-stack internal evaluate node NT[4] 413. In FIG. 3, node NT[0] 303 is poorly isolated because it has multiple devices attached to it that could be active simultaneously. Rather than connecting all of the devices directly to the inverter output driver as shown in FIG. 3, the devices have been segregated by creating two new internal evaluate nodes, NT[0] 403 and NT[4] 413. A static CMOS NAND device 451 is used to combine NT[0] 403 and NT[4] 413 into the intended output.

In FIG. 4, transistors 412 and 404, which conduct when A=1 and B=0, are connected to internal evaluate node NT[4] 413 instead of internal evaluate node NT[0] 403. The worst case parasitic capacitance on internal evaluate node NT[0] 403 in FIG. 4 is reduced from that in FIG. 3, because only two transistors attached to NT[0] 403 can be on at the same time (transistors 422 and 424, which conduct when B=0), as opposed to three transistors in the gate shown in FIG. 3.

While this capacitance isolation technique can be useful at times, in this case it actually resulted in slightly worse performance than the FIG. 3 gate (as will be seen below). This is because the NAND device output, which is slower than an inverter output because the NAND device has more p-transistors than the simple invertors used on the output lines, counteracted the slightly faster N-tree evaluation.

The AND gate shown in FIG. 4 has 16 N-channel transistors, like the gate shown in FIG. 3. It has 10 output transistors, however, and 5 precharge transistors for a total of 31 transistors.

Figure 5:
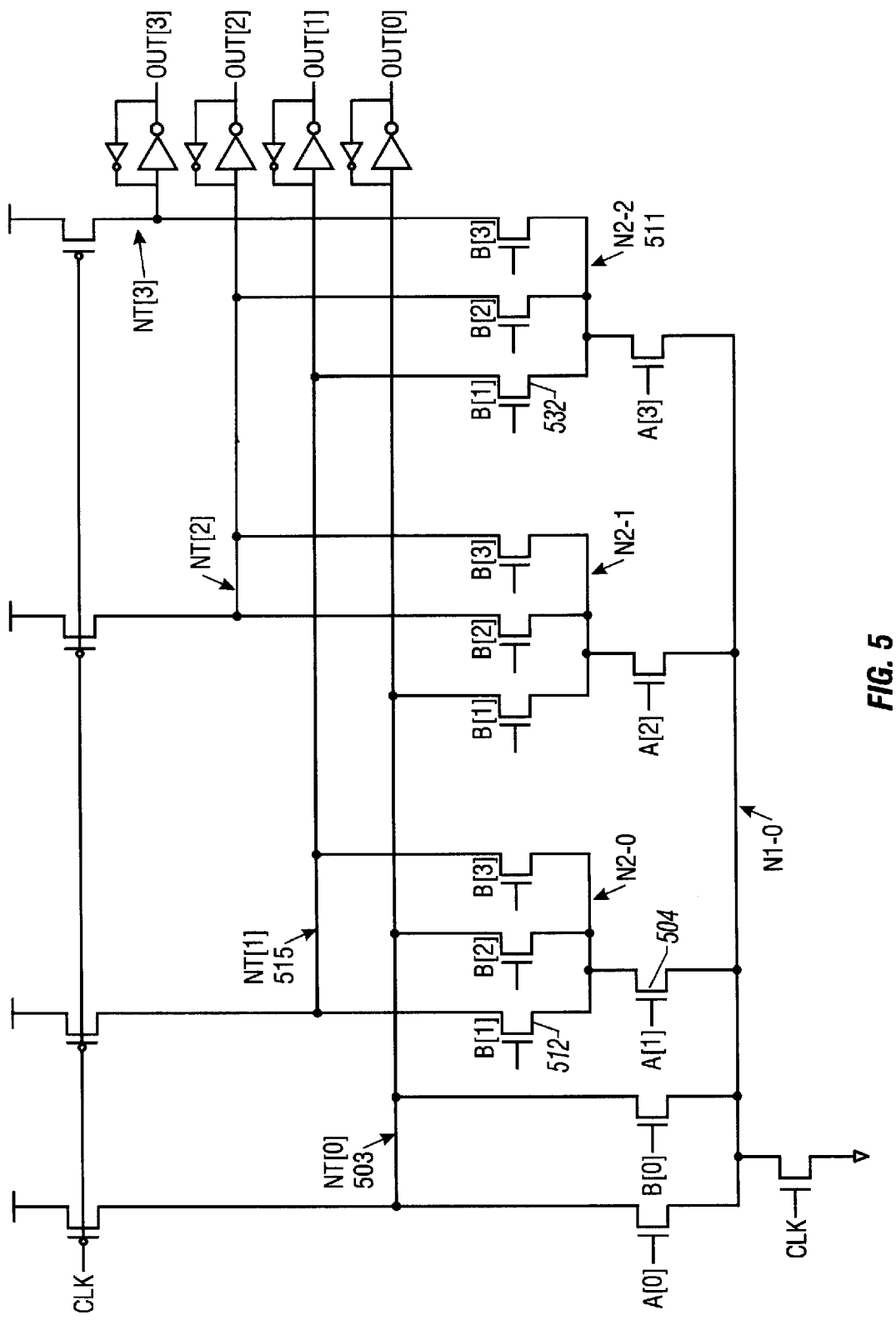
FIG. 5 is a N-NARY 1-of-4 AND gate with a different N-tree structure, with slightly improved capacitance isolation over the FIGS. 3 and 4 AND gates.

The AND gate shown in FIG. 5 uses only inverter outputs, but has a different N-tree structure than the first two gates. In FIG. 5, internal evaluate node NT[0] 503 never has a parasitic transistor turned on. However, internal evaluate node NT[1] 515 has a parasitic transistor turned on when B=1. For example, when A=1 and B=1, transistors 504, 512, and 532 conduct. The selected discharge path is from internal evaluate node NT[1] 515 through transistors 512 and 504. However, transistor 532 is also conducting, coupling intermediate node 511 to internal evaluate node NT[1] 515. Nevertheless, because this gate has no NAND output gates, it performs better than either of the gates shown in FIG. 3 and FIG. 4. This gate has only 14 N-channel transistors, 8 output transistors, and 4 precharge transistors for a total of 26 transistors.

Figure 6:
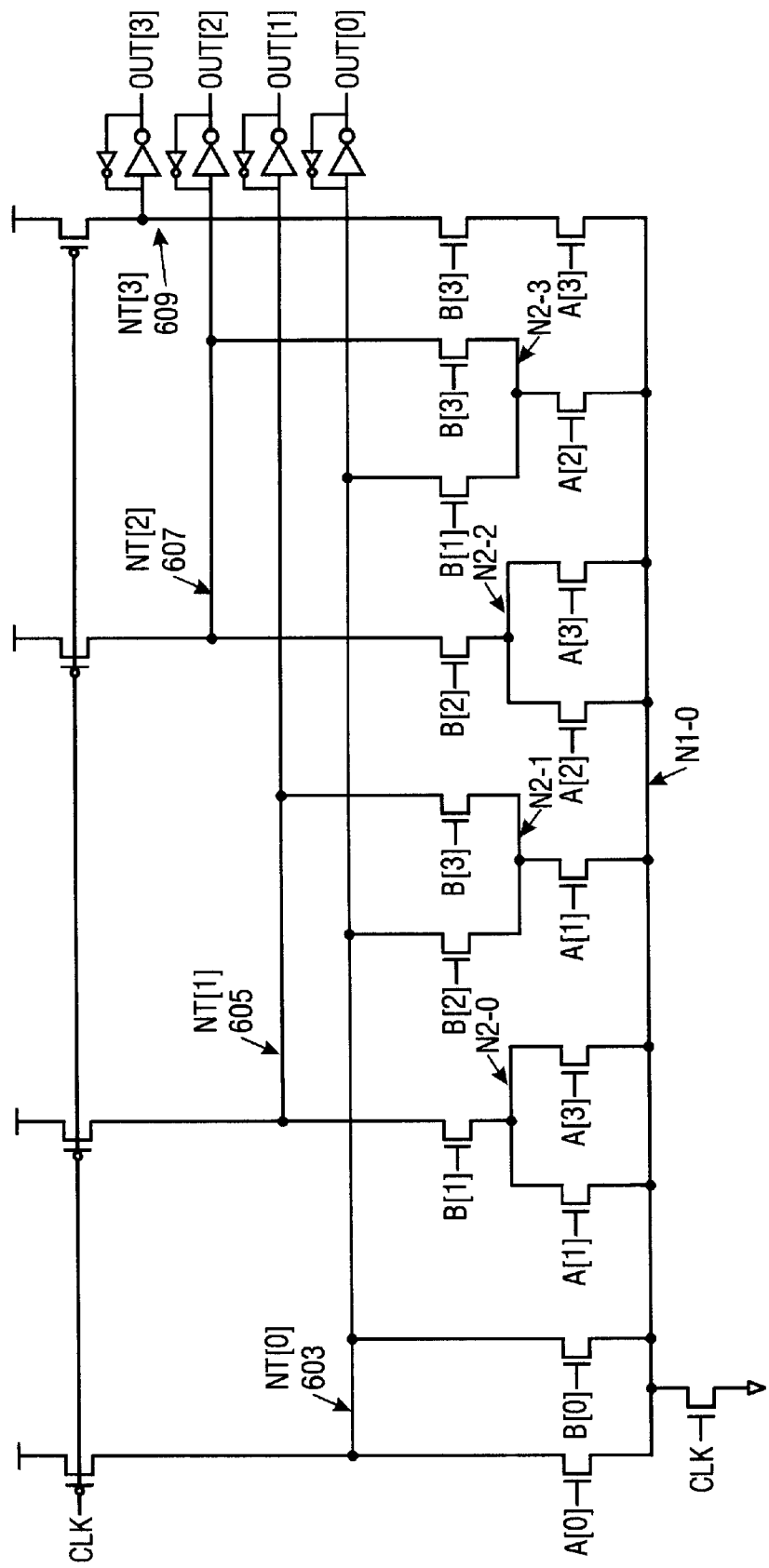
FIG. 6 is a N-NARY 1-of-4 AND gate with no parasitic capacitance (i.e., perfect capacitance isolation).

Finally, the gate shown in FIG. 6 has yet another N-tree structure but still has only output inverters (no NAND output gates). This implementation has no parasitic transistor capacitance at all; the only transistors that are turned on for each input combination are the transistors actively involved in pulling the top-of-stack internal evaluate nodes 603, 605, 607 and 609 down to ground. This gate has 16

N-channel transistors, 8 output transistors, and 4 precharge transistors for a total of 28 transistors. While the FIG. 6 gate has more transistors than the gate shown in FIG. 5, it actually performs better than the gate shown in FIG. 5 (i.e., it is smaller at the same speed).

Table 3 summarizes the performance of the FIGS. 3–6 AND gates. These results were obtained by optimizing the transistor sizes in each gate to minimize total transistor width while meeting a specific delay goal (in this case, 150 ps while driving 200 fF of output load).

TABLE 3

| Gate Identifier | Total # Transistors | Total Transistor Width (microns) |
|---|---|---|
| FIG. 3 | 28 | 474 |
| FIG. 4 | 31 | 513 |
| FIG. 5 | 26 | 443 |
| FIG. 6 | 28 | 234 |

As shown in Table 3, the reduced parasitic capacitance in the gate shown in FIG. 6 allowed the FIG. 6 gate to achieve the specified goal with less overall transistor width even though this design did not have the smallest number of transistors.

In summary, the present invention comprises a logic device with improved capacitance isolation, and a design methodology that reduces parasitic capacitance, allowing designers to achieve specific design timing and output goals with smaller circuits. The logic device further comprises an output signal having a first internal evaluate node and a second evaluate node. Additionally, the logic device comprises a first input signal that has a first input wire and a second input wire where the first input wire corresponds to a first possible value of the first input signal and the second input wire corresponds to a second possible value of the first input signal. The logic device further comprises a first plurality of intermediate nodes that includes a first intermediate node. Additionally, the logic device includes a first plurality of transistors that further includes a first transistor coupling the first internal evaluate node to the first intermediate node and being gated by the first wire of the first input signal. And finally, the logic device of the present invention includes a second transistor that couples the second internal evaluate node to the first intermediate node that is gated by the second wire of the first input signal. At most, either the first internal evaluate node or the second internal evaluate node couples to the first intermediate node with the second transistor substantially preventing residual charge on the second internal evaluate node from being passed to the first intermediate node when the first input value corresponds to the first possible value.

Other embodiments of the invention will be apparent to those skilled in the art after considering this specification in conjunction with the N-NARY Patent or after practicing the disclosed invention. The specification and examples above are exemplary only, with the true scope of the invention being indicated by the following claims.

We claim the following invention:

1. A logic device with improved capacitance isolation, comprising:
   an output signal having a first internal evaluate node and a second internal evaluate node;
   a first input signal having a first input wire and a second input wire, the first input wire corresponding to a first possible value of the first input signal and the second input wire corresponding to a second possible value of the first input signal;
   a first plurality of intermediate nodes including a first intermediate node;
   a first plurality of transistors, including
      a first transistor coupling the first internal evaluate node to the first intermediate node and being gated by the first wire of the first input signal; and
      a second transistor coupling the second internal evaluate node to the first intermediate node and being gated by the second wire of the first input signal, wherein at most one of the first internal evaluate node and the second internal evaluate node is electrically coupled to the first intermediate node, the second transistor substantially preventing residual charge on the second internal evaluate node from being passed to the first intermediate node when the first input value corresponds to the first possible value.

2. The logic device of claim 1, wherein:
   the first plurality of intermediate nodes further includes a second intermediate node;
   the first plurality of transistors further includes
      a third transistor coupling the first internal evaluate node to the second intermediate node and being gated by the first wire of the first input signal; and
      a fourth transistor coupling the second internal evaluate node to the second intermediate node and being gated by the second wire of the first input signal, wherein at most one of the first internal evaluate node and the second internal evaluate node is electrically coupled to the second intermediate node, the fourth transistor substantially preventing residual charge on the second internal evaluate node from being passed to the second intermediate node when the first input value corresponds to the first possible value.

3. The logic device of claim 2, further comprising:
   a virtual ground node;
   a second input signal;
   a second plurality of transistors, including
      a fifth transistor coupling the first intermediate node to the virtual ground node and being gated by the first wire of the second input signal; and
      a sixth transistor coupling the second intermediate node to the virtual ground node and being gated by the second wire of the second input signal, wherein at most one of the first intermediate node and the second intermediate node is electrically coupled to the virtual ground node, the sixth transistor substantially preventing residual charge on the second intermediate node from being passed to the virtual ground node when the first input value corresponds to the first possible value.

4. The logic device of claim 1, wherein:
   the first plurality of intermediate nodes further includes a second intermediate node;
   the first plurality of transistors further includes
      a third transistor coupling the first internal evaluate node to the second intermediate node and being gated by the first wire of the first input signal; and
      a fourth transistor coupling the second internal evaluate node to the second intermediate node and being gated by the second wire of the first input signal, wherein at most one of the first internal evaluate node and the second internal evaluate node is electrically connected to the second intermediate node, the fourth transistor substantially preventing residual charge on the second internal evaluate node from being passed to the first internal evaluate node via the first intermediate node when the first input value corresponds to the first possible value.

5. The logic device of claim 1, further comprising:

a virtual ground node;

a first evaluation path having a plurality of transistors coupled in series between the first internal evaluate node and the virtual ground node and having a plurality of intermediate nodes between the transistors, the plurality of intermediate nodes including a first intermediate node, the first evaluation path including a first portion coupled between the first internal evaluate node and a first intermediate node, and a second portion coupled between the first intermediate node and the virtual ground node;

a second evaluation path, having a plurality of transistors coupled in series between the first internal evaluate node and one of the intermediate nodes;

the first input signal having at least two wires, the first input signal selecting at most one of the first internal evaluate node and the second evaluation path.

6. The logic device of claim 5, wherein:

the first portion further includes a second intermediate node, the second intermediate node being coupled to the first evaluation node and further being coupled to the first intermediate node; and a third evaluation path, having a plurality of transistors coupled in series between a third internal evaluate node and the second intermediate node.

7. A system that comprises logic gates with improved capacitance, comprising:

an output signal having a first internal evaluate node and a second internal evaluate node;

a first input signal having a first input wire and a second input wire, the first input wire corresponding to a first possible value of the first input signal and the second input wire corresponding to a second possible value of the first input signal;

a first plurality of intermediate nodes including a first intermediate node;

a first plurality of transistors, including a first transistor coupling the first internal evaluate node to the first intermediate node and being gated by the first wire of the first input signal; and a second transistor coupling the second internal evaluate node to the first intermediate node and being gated by the second wire of the first input signal, wherein at most one of the first internal evaluate node and the second internal evaluate node is electrically coupled to the first intermediate node, the second transistor substantially preventing residual charge on the second internal evaluate node from being passed to the first intermediate node when the first input value corresponds to the first possible value.

8. The system of claim 7, wherein:

the first plurality of intermediate nodes of each of the first logic device and the second logic device further includes a second intermediate node;

the first plurality of transistors of each of the first logic device and the second logic device further includes a third transistor coupling the first internal evaluate node to the second intermediate node and being gated by the first wire of the first input signal; and a fourth transistor coupling the second internal evaluate node to the second intermediate node and being gated by the second wire of the first input signal, wherein at most one of the first internal evaluate node and the second internal evaluate node is electrically coupled to the second intermediate node, the fourth transistor substantially preventing residual charge on the second internal evaluate node from being passed to the second intermediate node when the first input value corresponds to the first possible value.

9. The system of claim 8, wherein:

each of the first logic device and the first logic device further comprises:

a virtual ground node;

a second input signal;

a second plurality of transistors, including a fifth transistor coupling the first intermediate node to the virtual ground node and being gated by the first wire of the second input signal; and a sixth transistor coupling the second intermediate node to the virtual ground node and being gated by the second wire of the second input signal, wherein at most one of the first intermediate node and the second intermediate node is electrically coupled to the virtual ground node, the sixth transistor substantially preventing residual charge on the second intermediate node from being passed to the virtual ground node when the first input value corresponds to the first possible value.

10. The system of claim 7, wherein:

the first plurality of intermediate nodes of each of the first logic device and the second logic device further includes a second intermediate node;

the first plurality of transistors of each of the first logic device and the second logic device further includes a third transistor coupling the first internal evaluate node to the second intermediate node and being gated by the first wire of the first input signal; and a fourth transistor coupling the second internal evaluate node to the second intermediate node and being gated by the second wire of the first input signal, wherein at most one of the first internal evaluate node and the second internal evaluate node is electrically coupled to the second intermediate node, the fourth transistor substantially preventing residual charge on the second internal evaluate node from being passed to the first internal evaluate node via the first intermediate node when the first input value corresponds to the first possible value.

11. The system of claim 7, wherein:

a virtual ground node;

a first evaluation path having a plurality of transistors coupled in series between the first internal evaluate node and the virtual ground node and having a plurality of intermediate nodes between the transistors, the plurality of intermediate nodes including a first intermediate node, the first evaluation path including a first portion coupled between the first internal evaluate node and a first intermediate node, and a second portion coupled between the first intermediate node and the virtual ground node;

a second evaluation path, having a plurality of transistors coupled in series between the first internal evaluate node and one of the intermediate nodes;

a first input signal having at least two wires, the first input signal selecting at most one of the first internal evaluate node and the second evaluation path.

12. A method to make a logic device with improved capacitance isolation, comprising:

providing an output signal having a first internal evaluate node and a second internal evaluate node;

providing a first input signal having a first input wire and a second input wire, the first input wire corresponding to a first possible value of the first input signal and the second input wire corresponding to a second possible value of the first input signal;

providing a first plurality of intermediate nodes including a first intermediate node; and providing a first plurality of transistors that includes a first transistor coupling the first internal evaluate node to the first intermediate node and being gated by the first wire of the first input signal, and a second transistor coupling the second internal evaluate node to the first intermediate node and being gated by the second wire of the first input signal, wherein at most one of the first internal evaluate node and the second internal evaluate node is electrically coupled to the first intermediate node, the second transistor substantially preventing residual charge on the second internal evaluate node from being passed to the first intermediate node when the first input value corresponds to the first possible value.

13. The method of claim 12, further comprising:

providing a second intermediate node within the first plurality of intermediate nodes;

providing, within the first plurality of transistors:

a third transistor coupling the first internal evaluate node to the second intermediate node and being gated by the first wire of the first input signal; and a fourth transistor coupling the second internal evaluate node to the second intermediate node and being gated by the second wire of the first input signal, wherein at most one of the first internal evaluate node and the second internal evaluate node is electrically connected to the second intermediate node, the fourth transistor substantially preventing residual charge on the second internal evaluate node from being passed to the second intermediate node when the first input value corresponds to the first possible value.

14. The method of claim 13, further comprising:

providing a virtual ground node;

providing a second input signal;

providing a second plurality of transistors, including a fifth transistor coupling the first intermediate node to the virtual ground node and being gated by the first wire of the second input signal; and a sixth transistor coupling the second intermediate node to the virtual ground node and being gated by the second wire of the second input signal, wherein at most one of the first intermediate node and the second intermediate node is electrically connected to the virtual ground node, the sixth transistor substantially preventing residual charge on the second intermediate node from being passed to the virtual ground node when the first input value corresponds to the first possible value.

15. The method of claim 14, further comprising:

a second intermediate node, within the first plurality of intermediate nodes; providing, within the first plurality of transistors:

a third transistor coupling the first internal evaluate node to the second intermediate node and being gated by the first wire of the first input signal; and a fourth transistor coupling the second internal evaluate node to the second intermediate node and being gated by the second wire of the first input signal, wherein at most one of the first internal evaluate node and the second internal evaluate node is electrically connected to the second intermediate node, the fourth transistor substantially preventing residual charge on the second internal evaluate node from being passed to the first internal evaluate node via the first intermediate node when the first input value corresponds to the first possible value.

16. The method of claim 14, further comprising:

providing a virtual ground node;

providing a first evaluation path, including coupling a plurality of transistors in series between the first internal evaluate node and the virtual ground node and providing a plurality of intermediate nodes between the transistors, the plurality of intermediate nodes including a first intermediate node, the first evaluation path including a first portion coupled between the first internal evaluate node and a first intermediate node, and a second portion coupled between the first intermediate node and the virtual ground node;

providing a second evaluation path, having a plurality of transistors coupled in series between the first internal evaluate node and one of the intermediate nodes; and providing a first input signal having at least two wires, the first input signal selecting at most one of the first internal evaluate node and the second evaluation path.

17. The method of claim 16, further comprising:

providing a second intermediate node within the first portion, the second intermediate node being coupled to the first evaluation node and further being coupled to the first intermediate node; and providing a third evaluation path, having a plurality of transistors coupled in series between a third internal evaluate node and the second intermediate node.

18. A method that uses a logic device with improved capacitance isolation, comprising:

receiving a first input signal that comprises a first input wire and a second input wire, the first input wire corresponding to a first possible value of the first input signal and the second input wire corresponding to a second possible value of the first input signal;

providing a first plurality of intermediate nodes including a first intermediate node;

providing a first plurality of transistors, including a first transistor coupling a first internal evaluate node to the first intermediate node and being gated by the first wire of the first input signal;

providing a second transistor coupling a second internal evaluate node to the first intermediate node and being gated by the second wire of the first input signal, wherein at most one of the first internal evaluate node and the second internal evaluate node is electrically coupled to the first intermediate node, the second transistor substantially preventing residual charge on the second internal evaluate node from being passed to the first intermediate node when the first input value corresponds to the first possible value; and generating an output signal that couples to the first internal evaluate node and the second evaluate node.

19. The method of claim 18, wherein:

the first plurality of intermediate nodes further includes a second intermediate node;

the first plurality of transistors further includes
- a third transistor coupling the first internal evaluate node to the second intermediate node and being gated by the first wire of the first input signal; and
- a fourth transistor coupling the second internal evaluate node to the second intermediate node and being gated by the second wire of the first input signal, wherein at most one of the first internal evaluate node and the second internal evaluate node is electrically connected to the second intermediate node, the fourth transistor substantially preventing residual charge on the second internal evaluate node from being passed to the second intermediate node when the first input value corresponds to the first possible value.

20. The method of claim 19, further comprising:

a virtual ground node;

a second input signal;

a second plurality of transistors, including
- a fifth transistor coupling the first intermediate node to the virtual ground node and being gated by the first wire of the second input signal; and
- a sixth transistor coupling the second intermediate node to the virtual ground node and being gated by the second wire of the second input signal, wherein at most one of the first intermediate node and the second intermediate node is electrically connected to the virtual ground node, the sixth transistor substantially preventing residual charge on the second intermediate node from being passed to the virtual ground node when the first input value corresponds to the first possible value.

21. The method of claim 18, wherein:

the first plurality of intermediate nodes further includes a second intermediate node;

the first plurality of transistors further includes
- a third transistor coupling the first internal evaluate node to the second intermediate node and being gated by the first wire of the first input signal; and
- a fourth transistor coupling the second internal evaluate node to the second intermediate node and being gated by the second wire of the first input signal, wherein at most one of the first internal evaluate node and the second internal evaluate node is electrically connected to the second intermediate node, the fourth transistor substantially preventing residual charge on the second internal evaluate node from being passed to the first internal evaluate node via the first intermediate node when the first input value corresponds to the first possible value.

22. The method of claim 18, further comprising:

a virtual ground node;

a first evaluation path having a plurality of transistors coupled in series between the first internal evaluate node and the virtual ground node and having a plurality of intermediate nodes between the transistors, the plurality of intermediate nodes including a first intermediate node, the first evaluation path including
- a first portion coupled between the first internal evaluate node and a first intermediate node, and
- a second portion coupled between the first intermediate node and the virtual ground node;
- a second evaluation path, having a plurality of transistors coupled in series between the first internal evaluate node and one of the intermediate nodes;
- the first input signal having at least two wires, the first input signal selecting at most one of the first internal evaluate node and the second evaluation path.

23. The method of claim 22, wherein:

the first portion further includes a second intermediate node, the second intermediate node being coupled to the first evaluation node and further being coupled to the first intermediate node; and a third evaluation path, having a plurality of transistors coupled in series between a third internal evaluate node and the second intermediate node.

* * * * *